(12) United States Patent
Otremba

(10) Patent No.: US 7,161,234 B2
(45) Date of Patent: Jan. 9, 2007

(54) SEMICONDUCTOR COMPONENT AND PRODUCTION METHOD SUITABLE THEREFOR

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 53 days.

(21) Appl. No.: 10/897,753

(22) Filed: Jul. 23, 2004

(65) Prior Publication Data

US 2005/0082679 A1  Apr. 21, 2005

(30) Foreign Application Priority Data

Jul. 24, 2003  (DE) .............................. 103 33 800

(51) Int. Cl.
*H01L 23/02* (2006.01)

(52) U.S. Cl. ............... 257/686; 257/777; 257/E23.014; 438/109; 438/117

(58) Field of Classification Search ................ 257/686, 257/712, 728, 777, E25.014; 438/14, 52, 438/117, 109

See application file for complete search history.

(56) References Cited

U.S. PATENT DOCUMENTS

| 6,031,279 | A | | 2/2000 | Lenz | 257/686 |
| RE36,613 | E | * | 3/2000 | Ball | 257/777 |
| 6,369,447 | B1 | * | 4/2002 | Mori | 257/777 |
| 6,475,822 | B1 | * | 11/2002 | Eldridge et al. | 438/52 |
| 2003/0201545 | A1 | * | 10/2003 | Lin et al. | 257/778 |

* cited by examiner

*Primary Examiner*—Fernando L. Toledo
(74) *Attorney, Agent, or Firm*—Dicke, Billig & Czaja, PLLC

(57) ABSTRACT

A semiconductor component has a lower semiconductor element and an upper semiconductor element. A contact-making region is provided between the lower and the upper semiconductor element that makes contact with an upper side of the lower semiconductor element and an underside of the upper semiconductor element. The contact-making region is formed on appropriate extensions of those bonding wires that are used as electrical terminals of the contact-making region.

11 Claims, 4 Drawing Sheets

SEMICONDUCTOR COMPONENT AND PRODUCTION METHOD SUITABLE THEREFOR

CROSS-REFERENCE TO RELATED APPLICATIONS

This Utility Patent Application claims priority to German Patent Application No. DE 103 33 800.4, filed on Jul. 24, 2003, which is incorporated herein by reference.

BACKGROUND

The invention relates to a semiconductor component and a production method suitable therefor.

In the semiconductor technology, what are known as "chip-on-chip" components have been known for a long time and are used for an extremely wide variety of purposes. These semiconductor components are distinguished by the fact that they have at least two chips or semiconductor elements layered above one another that are connected electrically to one another by means of corresponding contact-making regions. Layering the chips/semiconductor elements above one another permits the production of extremely compact semiconductor components.

In the following text, with reference to FIG. 1, a "chip-on-chip" semiconductor component of this type will be described. A semiconductor component 1' has a housing 2, from which first and second electrical leads 3a and 3b, which are used as external terminals, are led out. Provided in the housing 2 is a mounting device 4, which is used simultaneously as a heat sink and as a contact region for a drain terminal and also as a carrier for the entire arrangement mounted thereon. Fitted to the mounting device 4 is a first chip 5 which, for example, contains a plurality of transistors. Fitted to the first chip 5 are a second chip 6 and a third chip 7, which are each connected electrically to the first chip 5 by means of a contact-making region (here: a first contact-making layer 8 and a second contact-making layer 9). The surfaces of the second and third chips 6, 7 in each case form source contacts, the source contact of the second chip 6 being connected to the first electrical lead 3a via a first bonding wire 10. In a manner corresponding to this, the source contact of the third chip 7 is connected to the second lead 3b via a second bonding wire 11. The first contact-making layer 8 is connected to the first lead 3a by means of a third bonding wire 12, and in a manner corresponding to this, the second contact-making layer 9 is connected to the second lead 3b by means of a fourth bonding wire 13. The first contact-making layer 8 forms a source contact for the first chip 5 and, at the same time, the drain contact for the second chip 6. In a corresponding way, the second contact-making layer 9 forms a source contact for the first chip 5 and the drain contact for the third chip 7.

The semiconductor component illustrated in FIG. 1 has the disadvantage that a first contact-making area 14 on the first contact-making layer 8 for forming a contact between the third bonding wire 12 and the first contact-making layer 8 is relatively large, so that an extent of the second chip 6 horizontally in the direction of the first lead 3a is limited. Analogous considerations apply to a second contact-making area 15 on the second contact-making layer 9.

SUMMARY

One embodiment of the present invention specifies a semiconductor component, and a production method suitable therefore. According to one embodiment of the invention, a semiconductor component has a lower semiconductor element and an upper semiconductor element, there being provided between the lower and the upper semiconductor element a contact-making region that makes contact with an upper side of the lower semiconductor element and an underside of the upper semiconductor element. The contact-making region comprises corresponding extensions of bonding wires that are used as electrical terminals of the contact-making region.

The previously conventional contact-making layer, which was provided between the lower and the upper semiconductor element, is therefore replaced by the bonding wire/bonding wires that were used to make contact with the contact-making layer.

The term "semiconductor element" in this case covers any desired semiconductor structures. For example, it includes a highly integrated chip or a simple structure that, for example, contains a single high power transistor.

One possible application of such a semiconductor component is represented by a bridge circuit. However, the invention is not restricted to this example.

As a result of the direct mounting of the upper semiconductor element on the bonding wires for making electrical contact with the contact-making region (intermediate plane, contact-making layer) of the upper and lower semiconductor element, the need for a bonding wire contact area in the contact-making region on the intermediate layer/contact-making layer is dispensed with, which means that the vertical extent of the upper semiconductor element can be enlarged. As a result, the physical utilization of the housing of the semiconductor component can be optimized.

Furthermore, the invention provides a method for producing a semiconductor component. The method includes applying bonding wire end sections to an upper side of a lower semiconductor element, applying an upper semiconductor element to the bonding wire end sections, and forming electrical contacts between the bonding wire end sections and the upper side/underside of the lower/upper semiconductor element by means of ultrasound and/or temperature treatment.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

In the figures, identical or mutually corresponding components or subassemblies are identified by the same designations.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
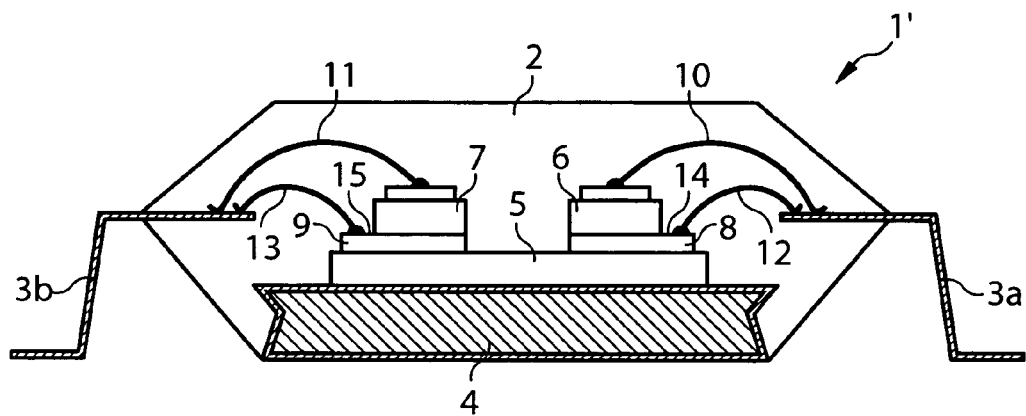
FIG. 1 illustrates the structure of a semiconductor component according to the prior art.
Figure 2:
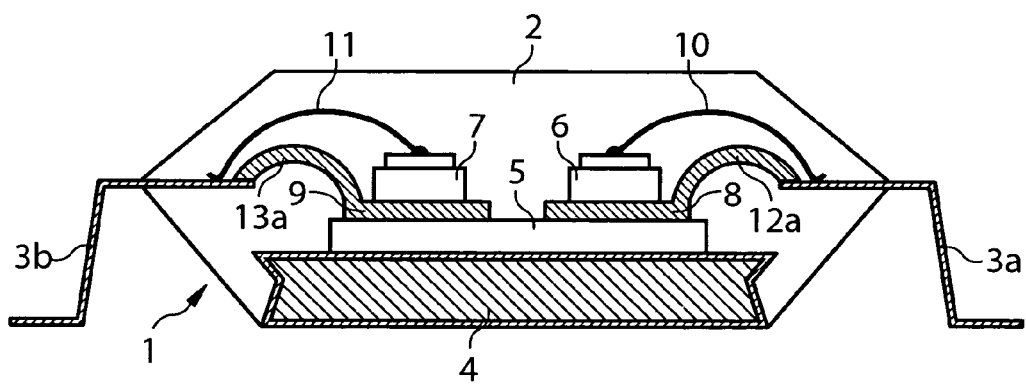
FIG. 2 illustrates the schematic structure of an embodiment of a semiconductor component according to the invention.

Semiconductor component 1 according to the invention illustrated in FIG. 2, has a structure which closely resembles the structure illustrated in FIG. 1. The difference is that the "combination" of the third bonding wire 12 and the first contact-making layer 8 is replaced by a first lengthened bonding wire 12a. In a manner analogous to this, the combination of the fourth bonding wire 13 and the second contact-making layer 9 is replaced by a second lengthened bonding wire 13a. End sections of the lengthened bonding wires 12a, 13a rest on the first chip 5, the second chip 6 and the third chip 7 being fitted directly to the end section of the first lengthened bonding wire 12a and the end section of the second lengthened bonding wire 13a. The bonding wire end sections thus form a contact-making connection between drain contacts of the second and third chips 6, 7 and source contacts of the first chip 5. In this way, the horizontal extent of the first and second chips 6, 7 can be enlarged, since the contact areas 14 and 15 illustrated in FIG. 1 can be omitted. Furthermore, the application of the first and second contact-making layer 8, 9 can be dispensed with, which simplifies the production method for the semiconductor component.

In the following text, an exemplary application of the semiconductor component according to the invention is to be described with reference to FIG. 3. A bridge circuit 20 has a housing 2, in which a mounting device 4 is accommodated. Fitted to the mounting device 4 is a first chip 5, on which in turn a second chip 6 and a third chip 7 are fitted. The second chip 6 is connected electrically to the first chip 5 via parts (end sections) of first lengthened bonding wires 12a, that is, the end sections of the bonding wires 12a make contact both with a drain zone of the second chip 6 and with a source zone of the first chip 5. Corresponding source contacts of the second chip 6 are connected via first bonding wires 10 to first electrical leads 3a, which lead out of the housing 2 and which represent the external terminals. Analogous considerations also apply to the third chip 7, which is connected electrically to the first chip 5 by end sections of second lengthened bonding wires 13a. These parts of the bonding wires 13a make contact both with source contacts of the first chip 5 and with drain contacts of the third chip 7. Corresponding source contacts of the third chip 7 are connected via second bonding wires 11 to second leads 3b, which lead out of the housing 2 and form corresponding external terminals.

In the following text using FIGS. 4A to 4D, an embodiment of the method according to the invention for producing a semiconductor component according to the invention, for example the bridge circuit illustrated in FIG. 3, will be explained in more detail.

In a first step (FIG. 4A), a double-stitch bonding wire 13a is fitted to the first chip 5. In a second step (FIG. 4B), a further chip (for example a third chip 7) is fitted to the double-stitch bonding wire 13a, that is to say pressed into the double-stitch bonding wire 13a. In a third step (FIG. 4C), an electrical contact is produced between an underside of the third chip 7 and an upper side of the first chip 5, by an ultrasound treatment/heat treatment being carried out. In a fourth step (FIG. 4D), a further bonding wire 11 is fitted to an upper side of the third chip 7.

The process of forming the electrical contact between the double-stitch bonding wire 13a (the bonding wire end sections) and the upper side of the first chip 5/the underside of the third chip 7 depends critically on the material of the bonding wire. For aluminum bonding wires, an ultrasound process at room temperature is used, whereas for gold bonding wires, ultrasound processes at about 200° C. are carried out. It should be mentioned here that the hardness of the bonding wires has an influence on the maximum ultrasound energy to be used and also on the pressure (when pressing in) during the contact-making process.

Figure 3:
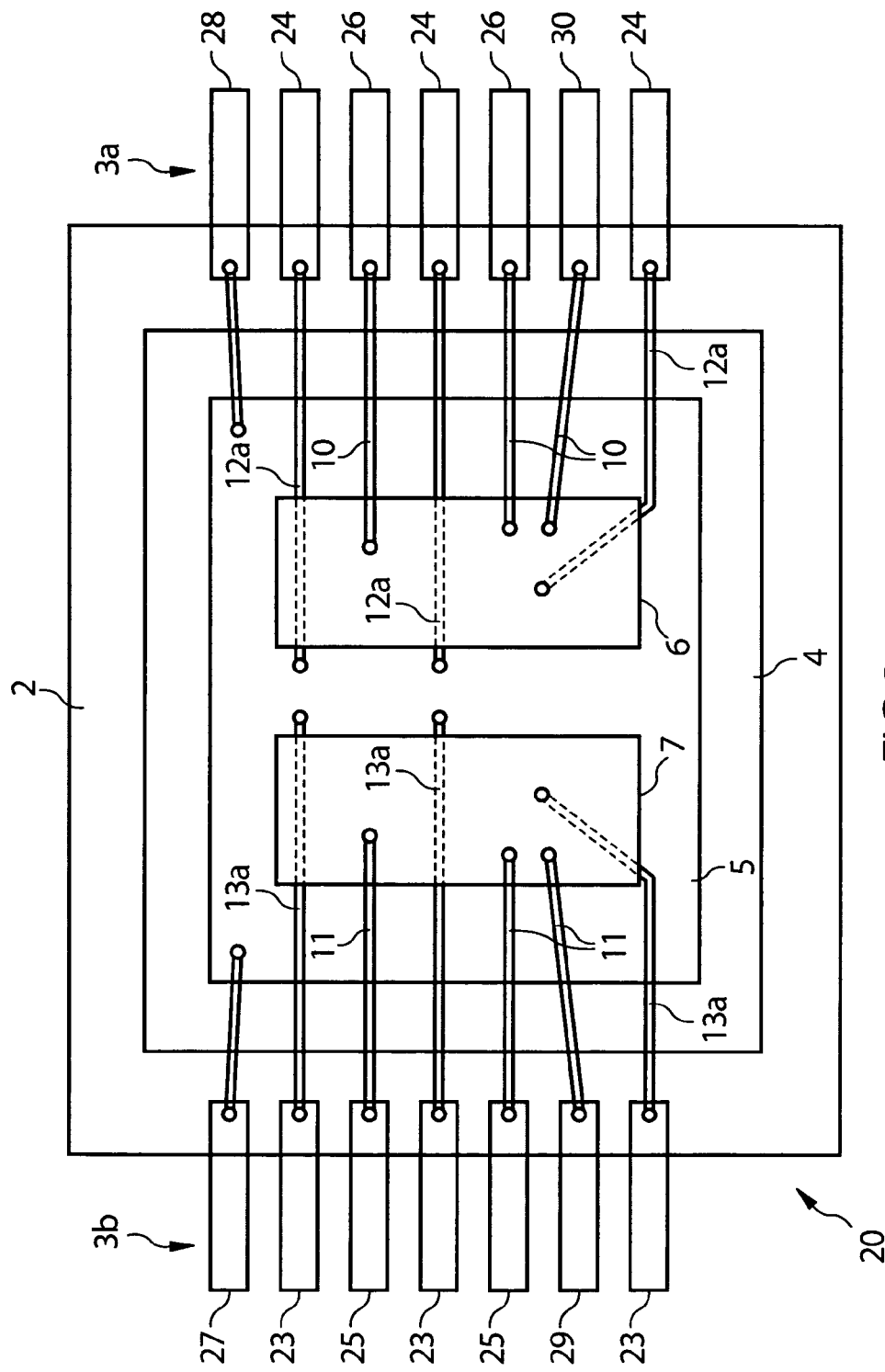
FIG. 3 illustrates an embodiment of a bridge circuit as an exemplary application of the semiconductor component according to the invention.
Figure 4A:
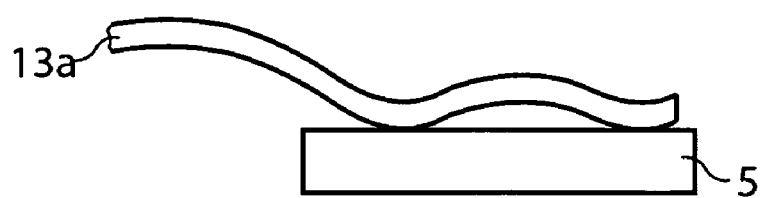
FIGS. 4A–4D illustrate an embodiment of the production method according to the invention.
Figure 4B:
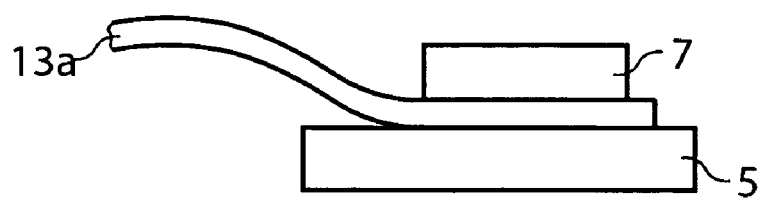
Figure 4C:
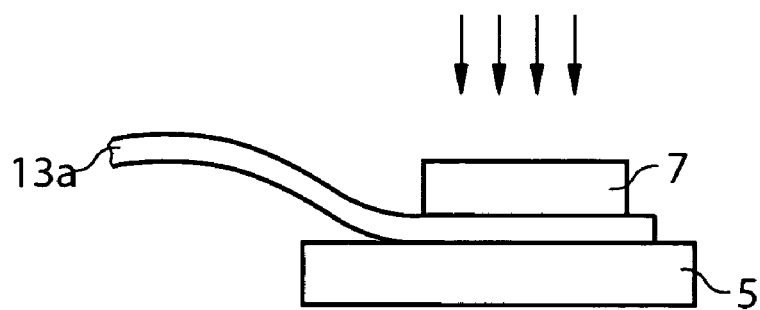
Figure 4D:
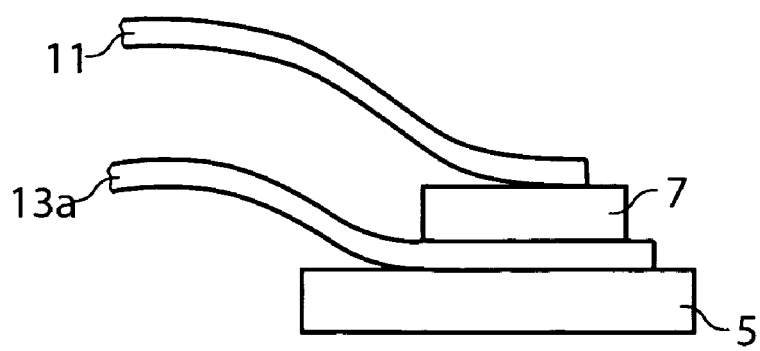
Figure 5:
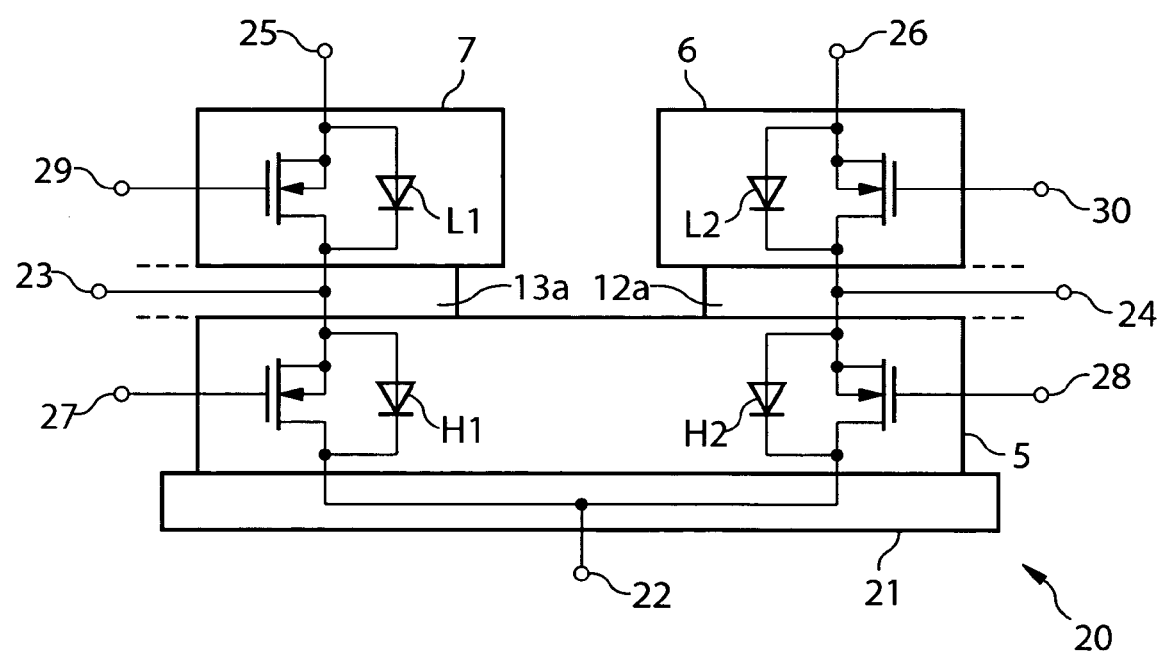
FIG. 5 illustrates a basic circuit diagram of the bridge circuit according to the invention from FIG. 3.

FIG. 5 illustrates a schematic representation of the circuit structure of the bridge circuit according to the invention illustrated in FIG. 3. The bridge circuit 20 has a cooling area 21, on which a first chip 5 is mounted. The first chip 5 contains two semiconductor switches H1, H2 isolated from each other on the source side. The two drain connections of the semiconductor switches H1 and H2 form the rear of the chip. The first chip 5 is mounted with the rear on the cooling area 21 and contact can be made with it via a first terminal 22. Fitted to the source areas of the two transistors H1 and H2 are two further chips, a second chip 6 and a third chip 7, which each contain a further power transistor L1 and L2. By means of the mounting, the source region of the transistor H1 is connected to the drain region of the transistor L1, and the source region of the transistor H2 is connected to the drain region of the transistor L2. Respective junctions of these connections can be connected externally via a second and a third terminal 23, 24. Contact can be made with the respective source regions of the transistors L1 and L2 via a fourth and fifth external terminal 25, 26, likewise by means of bonding, for example. A sixth to ninth terminal 27 to 30 is used for driving respective transistors H1, H2, L1 and L2.

As became clear in the preceding description, the invention relates to the optimization of the process of making electrical contact with an intermediate plane of chip-on-chip components, by the upper chip being mounted directly on the bonding wire or wires for making electrical contact with the intermediate plane. Previously, in order to make contact with the intermediate plane, a bonding wire contact area had to be made available on the lower chip, and thus could not be used for the chip-one-chip mounting. By mounting the chip located at the top directly on the bonding wire or wires for making electrical contact with the intermediate plane, this bonding wire contact area can also be used for the chip located at the top, and therefore the maximum chip area of the chip located at the top can be increased considerably. Therefore, a chip is mounted directly on a bonding wire, which means that a predefined housing volume can be utilized in an optimal way. In the bridge circuit illustrated in FIG. 3, after contact has been made with the front side of the chip located at the bottom by means of double-stitch aluminum bonding wires, the chip located at the top is pressed into the bonding wires with its rear, preferably consisting of aluminum, and contact is made in a comparable way with the standard aluminum wire bonds by means of ultrasound.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising;
    a lower semiconductor element;
    an upper semiconductor element; and
    a unitary bonding wire, one end of which is sandwiched between the lower and upper semiconductor elements, the bonding wire used as an electrical terminal and making contact with an upper side of the lower semiconductor element and an underside of the upper semiconductor element.

2. The semiconductor component of claim 1, wherein the semiconductor component is a bridge circuit.

3. The semiconductor component of claim 1, further including a second upper semiconductor element and a second contact-making region provided between the lower and second upper semiconductor element that makes contact with the upper side of the lower semiconductor element and an under side of the second upper semiconductor element.

4. The semiconductor component of claim 3, wherein the second contact-making region comprises corresponding extensions of bonding wires that are used as electrical terminals of the second contact-making region.

5. The semiconductor of claim 4, wherein the semiconductor elements are all contained in a housing.

6. The semiconductor of claim 5, further including external terminals extending from the housing and electrically coupled to the bonding wires.

7. The semiconductor component of claim 1, wherein the bonding wire is a double-stitch bonding wire.

8. A method for producing a semiconductor component comprising the following steps in the recited order:
    applying bonding wire end sections to an upper side of a lower semiconductor element;
    applying an upper semiconductor element to the bonding wire end sections;
    simultaneously forming electrical contacts between the bonding wire end sections and the upper side of the lower semiconductor element; and
    between the bonding wire end sections and the underside of the upper semiconductor element.

9. The method of claim 8, including forming the electrical contacts by means of ultrasound.

10. The method of claim 8, including forming the electrical contacts by means of temperature treatment.

11. A method for producing a semiconductor component comprising the following steps in the recited order;
    sandwiching a first end of a bonding wire end between an upper side of a lower semiconductor element and an underside of an upper semiconductor element; and
    simultaneously forming electrical contacts between the first end of the bonding wire and the upper side of the lower semiconductor element and between the first end of the bonding wire and the underside of the upper semiconductor element.

* * * * *